(12) United States Patent
Hu

(10) Patent No.: US 7,847,400 B2
(45) Date of Patent: Dec. 7, 2010

(54) SEMICONDUCTOR PACKAGE SUBSTRATE STRUCTURE AND MANUFACTURING METHOD THEREOF

(75) Inventor: Wen-Hung Hu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 188 days.

(21) Appl. No.: 12/114,517

(22) Filed: May 2, 2008

(65) Prior Publication Data

US 2008/0272501 A1 Nov. 6, 2008

(30) Foreign Application Priority Data

May 3, 2007 (TW) .............................. 96115687 A

(51) Int. Cl.
*H01L 23/48* (2006.01)
(52) U.S. Cl. ........................ 257/737; 257/780; 257/781; 257/741; 257/750
(58) Field of Classification Search ................. 257/737, 257/741, 750, 762, 766, 768, 780–781, E23.019, 257/E23.2, E23.021, E21.532, E21.536, E23.598; 438/778, FOR. 211, FOR. 343, FOR. 363, 438/FOR. 364, FOR. 395
See application file for complete search history.

(56) References Cited

U.S. PATENT DOCUMENTS

| 6,001,493 | A | * | 12/1999 | Rutledge et al. ............. 428/620 |
| 7,078,272 | B2 | * | 7/2006 | Ho et al. ...................... 438/127 |
| 2003/0022477 | A1 | * | 1/2003 | Hsieh et al. .................. 438/612 |
| 2006/0226544 | A1 | * | 10/2006 | Hsu et al. ..................... 257/737 |

* cited by examiner

*Primary Examiner*—N Drew Richards
*Assistant Examiner*—Jae Lee
(74) *Attorney, Agent, or Firm*—Schmeiser, Olsen & Watts LLP

(57) ABSTRACT

A semiconductor package substrate structure and a manufacturing method thereof are disclosed. The structure includes a substrate having a plurality of electrical connecting pads formed on at least one surface thereof; a plurality of electroplated conductive posts each covering a corresponding one of the electrical connecting pads and an insulating protective layer formed on the surface of the substrate and having a revealing portion for exposing the electroplated conductive posts therefrom. The invention allows the interval between the electroplated conductive posts to be minimized, the generation of concentrated stresses and the overflow of underfill to be avoided, as well as the reduction of the overall height of the fabricated package.

2 Claims, 6 Drawing Sheets

SEMICONDUCTOR PACKAGE SUBSTRATE STRUCTURE AND MANUFACTURING METHOD THEREOF

FIELD OF THE INVENTION

The present invention relates to a semiconductor package substrate structure and a manufacturing method thereof, and more particularly, to a semiconductor package substrate structure with electroplated conductive posts formed thereon and a manufacturing method thereof.

BACKGROUND OF THE INVENTION

In current flip-chip technology, there are electrode pads on an active face of a semiconductor chip in an integrated circuit (IC), while there are electrically connecting pads corresponding to the electrode pads on an organic circuit board. Solder structures or other conductive adhesives are formed between the electrode pads of the semiconductor chip and the electrically connecting pads of the circuit board, such that they provide electrical and mechanical connection therebetween. Related manufacturing processes are illustrated in FIGS. 1A to 1F as follows.

Referring to FIG. 1A, a circuit board 11 with a plurality of electrically connecting pads 111 and circuits 112 on one surface thereof is provided.

Referring to FIG. 1B, an insulating protective layer 12 is formed on the surface of the circuit board 11 that has the electrically connecting pads 111 by printing, spin coating or adhesion etc. The insulating protective layer 12 is patterned to form openings 120 in order to expose a portion of the upper surfaces of the electrically connecting pads 111.

Referring to FIG. 1C, a conductive layer 13 is formed on the insulating protective layer 12 and the openings 120, which is essentially used as an electrical conduction path in subsequent electroplating of the soldering materials.

Referring to FIG. 1D, a resist layer 14 is formed on the conductive layer 13 and patterned to have openings 140 therein for exposing the openings 120 of the insulating protective layer 12.

Referring to FIG. 1E, an electroplating process is performed on the circuit board 11. Owing to the conductive property of the conductive layer 13 which acts as an electrical conduction path during electroplating, electroplated conductive posts 15 can be formed in the openings 140 and 120. The tops of the electroplated conductive posts 15 exceed the openings 120 and form wings 151 in the openings 140.

Referring to FIG. 1F, the resist 14 and the underlying conductive layer 13 are removed such that the electroplated conductive posts 15 form projected wings 151 on the surface of the insulating protective layer 12.

However, in the above prior-art manufacturing processes, the sizes of the openings 120 and 140 are very small, usually around 50 μm to 60 μm, alignment is not easy. In order for the openings 140 to align with the openings 120, the size of the openings 140 is usually increased to reduce the difficulty in alignment and increase alignment precision. As the aperture of the openings 120 is getting even smaller, due to the limitation of machines, the size of the openings 140 may be much larger than that of the openings 120 or even twice as large.

The enlargement of the aperture of the openings 140 may result in wings 151 formed on the electroplated conductive posts 15. As a result, intervals between the electroplated conductive posts 15 have to increase, which hinders the formation of fine-pitch pre-soldering bumps to be formed on the electroplated conductive posts 15.

Moreover, since the wings 151 of the electroplated conductive posts 15 are projected from the insulating protective layer 14, they tend to experience detrimental stresses due to temperature variation and difference in coefficient of thermal expansion (CTE), especially between the electroplated conductive posts 15 and the wings 151.

Therefore, there is a need for a semiconductor package circuit board and a manufacturing method thereof that allow the formation of fine-pitch electroplated conductive posts on the electrically connecting pads of the substrate.

SUMMARY OF THE INVENTION

In the light of foregoing drawbacks, an objective of the present invention is to provide a semiconductor package substrate structure and a manufacturing method thereof that forms fine-pitch electroplated conductive posts on electrically connecting pads of a substrate.

Another objective of the present invention is to provide a semiconductor package substrate structure and a manufacturing method thereof that avoids stress concentration.

Still another objective of the present invention is to provide a semiconductor package substrate structure and a manufacturing method thereof that confines the flow of underfill.

In accordance with the above and other objectives, the present invention provides a semiconductor package substrate structure, which includes a substrate with a plurality of electrically connecting pads formed on at least one surface thereof; a plurality of electroplated conductive posts each fully covering a corresponding one of the electrically connecting pads and an insulating protective layer formed on the substrate with a revealing portion that exposes the electroplated conductive posts.

The surface of the substrate that has the electrically connecting pads also includes a plurality of circuits. This substrate surface also includes a dielectric layer, on which the electrically connecting pads and the circuits are formed. A conductive layer is formed between the dielectric layer and the electrically connecting pads and between the dielectric layer and the circuits.

The present invention further provides a method of manufacturing a semiconductor package substrate structure, which includes providing a substrate with a plurality of electrically connecting pads formed on at least one surface thereof; forming an electroplated conductive post on each of the electrically connecting pads that fully covers the top and sides of a corresponding one of the electrically connecting pads by electroplating and forming an insulating protective layer on the substrate with a revealing portion that exposes the electroplated conductive posts.

The surface of the substrate that has the electrically connecting pads also includes a plurality of circuits. The steps for manufacturing the electrically connecting pads and the circuits include providing a substrate with a dielectric layer on one surface thereof; forming a conductive layer being on the dielectric layer; forming a first resist layer on the conductive layer with a plurality of openings for exposing a portion of the conductive layer and forming electrically connecting pads and circuits in the openings by electroplating.

The steps for manufacturing the electroplated conductive posts include removing the first resist layer; forming a second resist layer on the conductive layer with openings at positions corresponding to the locations of the electrically connecting pads, so as to fully expose the tops and sides of the electrically connecting pads and forming electroplated conductive posts on the electrically connecting pads within the openings by electroplating. The steps may further include removing the second resist layer and the underlying conductive layer.

In the above semiconductor package substrate structure and its manufacturing method, the revealing portion can be a plurality of recesses not penetrating the insulating protective layer but exposing the tops and portions of the sides of the electroplated conductive posts. Alternatively, the revealing portion can be a plurality of openings penetrating the insulating protective layer, exposing a portion of the substrate and fully exposing the tops and the sides of the electroplated conductive posts. Alternatively, the revealing portion can be a recess region not penetrating the insulating protective layer, but exposing the tops and portions of the sides of the electroplated conductive posts. Alternatively, the revealing portion can be a groove penetrating the insulating protective layer, exposing a portion of the substrate and fully exposing the tops and the sides of the electroplated conductive posts.

As for the semiconductor package substrate structure of the present invention and its manufacturing method, the electroplated conductive posts formed therein do not have wings like the prior art, thus stress caused by temperature variation is reduced. In addition, the electroplated conductive posts now fully encapsulate the tops and sides of the electrically connecting pads, a stronger bonding can be achieved. Moreover, since the width of the electrically connecting pads is similar to that of normal circuit layers, the width of the electroplated conductive posts can still be smaller than the conventional electroplated conductive posts with wings. Unlike the prior art where insulating protective layer is formed prior to the electroplating of the electroplated conductive posts, in the present invention, the insulating protective layer is formed on the substrate after the electroplated conductive posts are formed with a revealing portion in the form of a recess, opening or groove to expose the tops and sides of the electroplated conductive posts. This avoids the problems associated with aligning the openings of the resist layer and the insulating protective layer, such as the formation of wings on top of the electroplated conductive posts and limitation in reduction of intervals between the electroplated conductive posts. In addition, underfill can be confined in the revealing portion, eliminating overfill. As a result of the dented revealing portion, the overall thickness of the semiconductor package can also be reduced.

BRIEF DESCRIPTION OF THE DRAWINGS

The present invention can be more fully understood by reading the following detailed description of the preferred embodiments, with reference made to the accompanying drawings, wherein:

FIG. 2J' is a cross-sectional view of an alternative embodiment of FIG. 2J;

FIG. 3B' is a cross-sectional view of an alternative embodiment of FIG. 3B;

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Referring to FIGS. 2A to 2J, a semiconductor package substrate structure and a manufacturing there according to a first embodiment of the present invention are depicted.

Figure 1A:
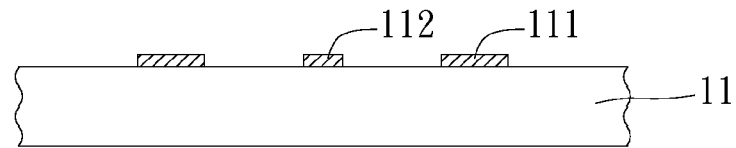
FIGS. 1A to 1F depict the flow for a conventional method of manufacturing embedded semiconductor chip.
Figure 1B:
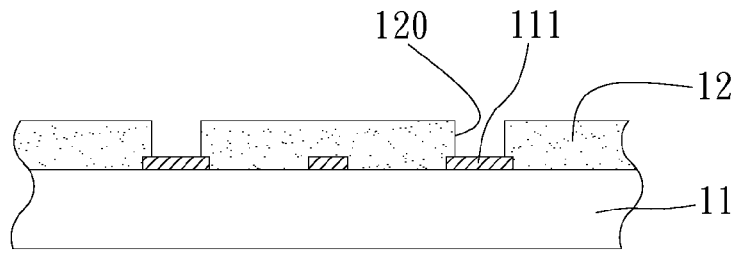
Figure 1C:
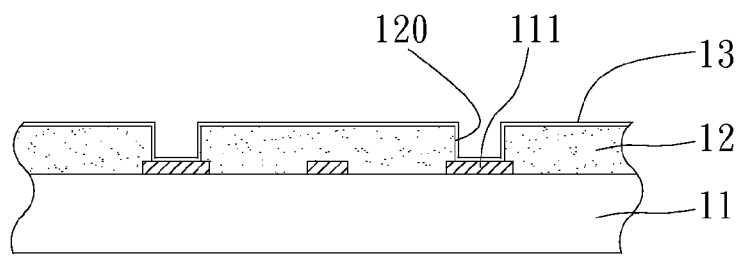
Figure 1D:
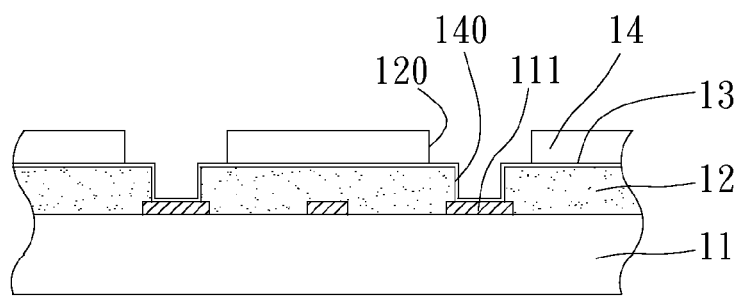
Figure 1E:
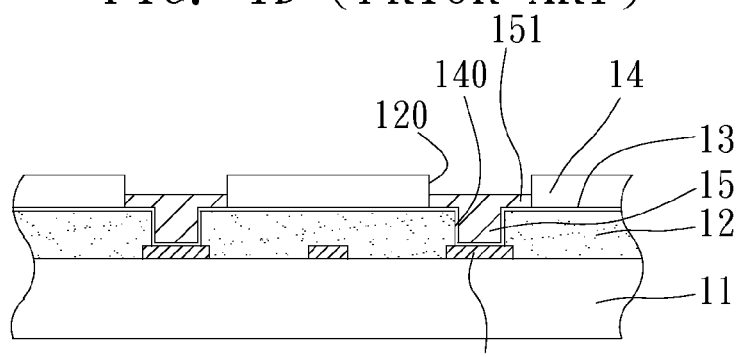
Figure 1F:
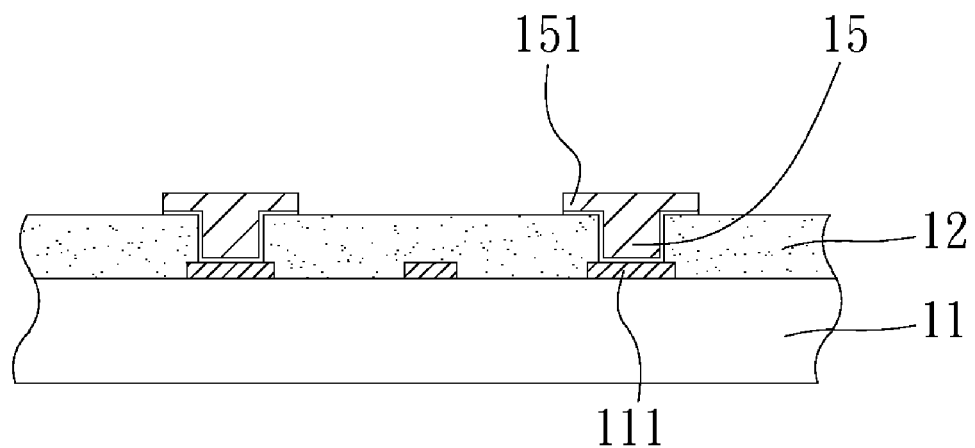
Figure 2A:
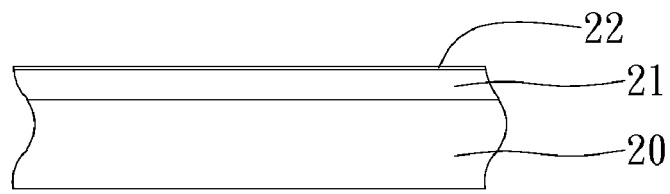
FIGS. 2A to 2J depict the flow for a method of manufacturing a substrate with an embedded semiconductor chip according to a first embodiment of the present invention.

Referring to FIG. 2A, a substrate 20 with dielectric layer 21 formed on at least one surface thereof is first provided. A conductive layer 22 formed on the dielectric layer 21 is used as an electrical conduction path necessary in subsequent electroplating of metal materials. The conductive layer 22 can be formed from a metal or a plurality of metals deposited together and can be selected from a single layer or multiple layers of copper, tin, nickel, chromium, titanium, copper-chromium etc. It can also be formed from conductive polymers, such as polyacetylene, polyaniline or sulfuric organic polymer.

Figure 2B:
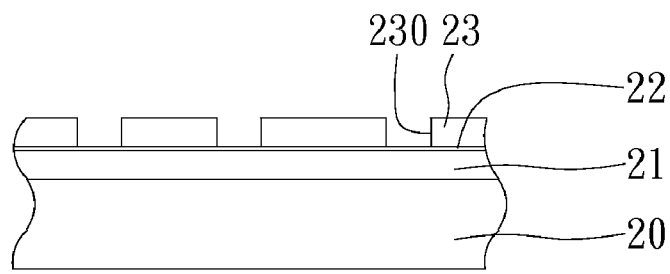

Referring to FIG. 2B, a first resist layer 23 is formed on the conductive layer 22 by printing, spin coating or adhesion. The first resist layer 23 undergoes a series of patterning steps (e.g. exposure, developing etc.) to form a plurality of openings 230 that expose a portion of the conductive layer 22. The first resist layer 23 can be a dry or liquid photoresist.

Figure 2C:
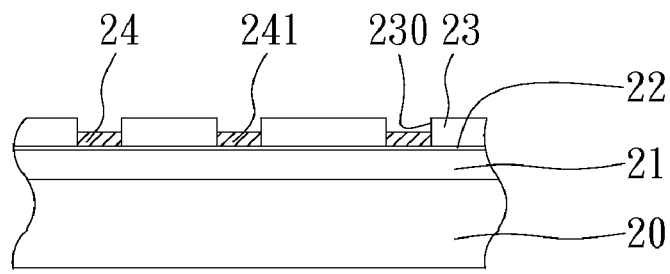

Referring to FIG. 2C, an electroplating process is performed for the conductive layer 22 in the openings 230 of the first resist layer 23. Owing to the conductive property of the conductive layer 22, circuits 24 and electrically connecting pads 241 can then be formed in the openings 230. The circuits 24 and/or the electrically connecting pads 241 can be electrically connected to the substrate 20 (not shown). The detailed manufacturing processes relating to formation of circuits and electrically connecting pads on the substrate are well known in the art, and will not be described further to avoid obscuring the technical features of the present invention.

Figure 2D:
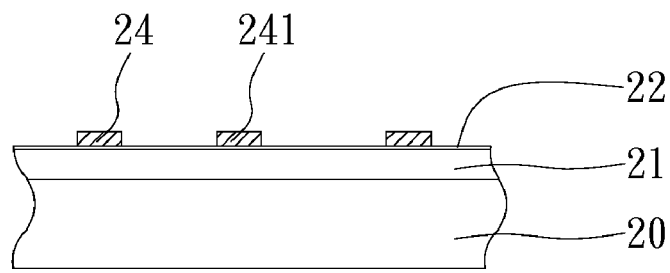

Referring to FIG. 2D, the first resist layer 23 is removed to expose the circuits 24, the electrically connecting pads 241 and the uncovered conductive layer 22.

Figure 2E:
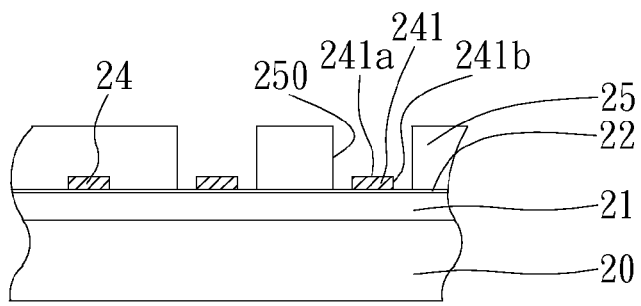

Referring to FIG. 2E, a second resist layer 25 is formed on the circuits 24, the electrically connecting pads 241 and the uncovered conductive layer 22. The second resist layer 25 can be a dry or liquid photoresist. The second resist layer 25 is then patterned (e.g. through exposure, development etc.) to form a plurality of openings 250 that expose the electrically connecting pads 241 while covering the circuits 24. Especially, the sides and tops of the electrically connecting pads 241 are completely exposed.

Figure 2F:
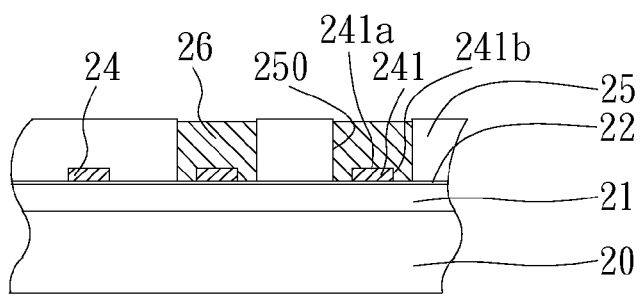

Referring to FIG. 2F, another electroplating process is performed on the substrate 20. Owing to the conductive property of the conductive layer 22, electroplated conductive posts 26 can be electroplated on the electrically connecting pads 241 in the openings 250. In particular, the electroplated conductive posts 26 fully encapsulate the tops 241a and sides 241b of the electrically connecting pads 241, which will have a better bonding strength compared to the prior art. In addition, the width of the electrically connecting pads is similar to that of normal circuit layers, even if the electroplated conductive posts 26 fully encapsulate the electrically connecting pads, the width of the electroplated conductive posts 15 is still smaller than that of the electroplated conductive posts 15 with wings 151 aforementioned in the prior art. The electroplated conductive posts 26 can be made of a material selected from lead, tin, silver, copper, gold, bismuth, antimony, zinc, nickel, chromium, magnesium, indium, tellurium, and gallium. In practice, copper is a cheaper and more mature electroplating material. However, the present invention is not limited to this.

Figure 2G:
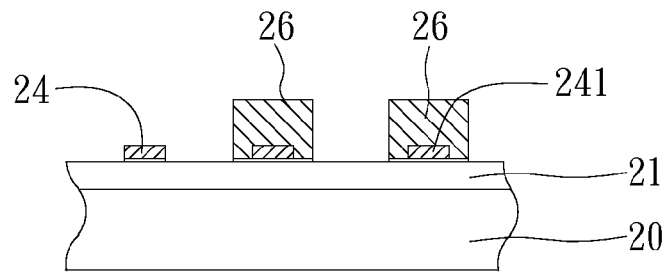

Referring to FIG. 2G, the second resist layer 25 and the underlying conductive layer 22 are removed.

Figure 2H:
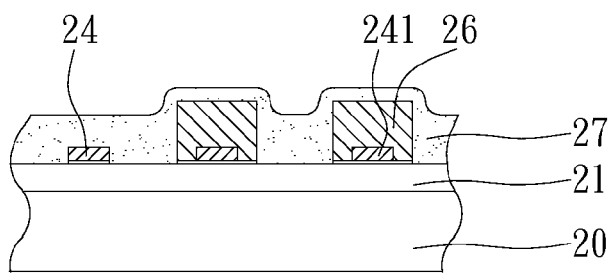

Referring to FIG. 2H, an insulating protective layer 27 is formed on the substrate 20. In this embodiment, the insulating protective layer is 27 formed on the dielectric layer 21, the circuits 24 and the electroplated conductive posts by any conventional processes such as printing, spin coating and adhesion. The insulating protective layer 27 may be a dewetting photosensitive insulating solder resist, such as one that based on epoxy resin. Alternatively, the insulating protective layer 27 may be an organic or inorganic anti-oxidation film made with dewetting and solder-resisting properties.

Figure 2I:
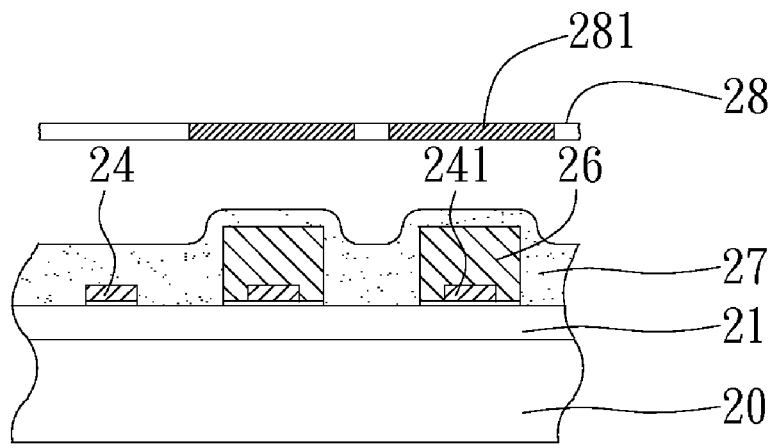

Referring to FIG. 2I, a photomask 28 with opaque regions 281 is disposed on the insulating protective layer 27, such that the portions of the insulating protective layer 27 that are not covered by the opaque regions 281 are exposed to light (cured).

Figure 2J:
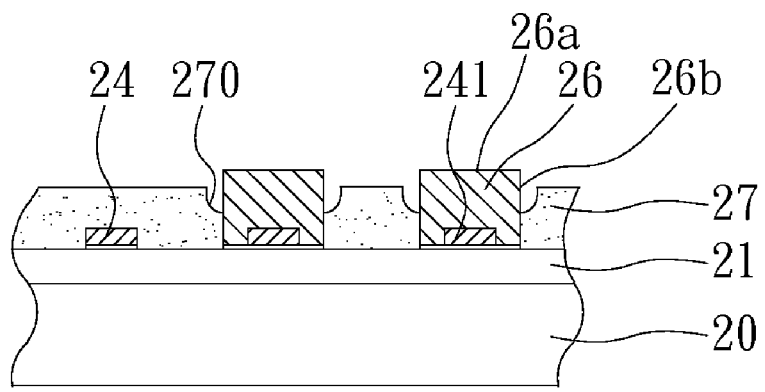
Figure 2J:
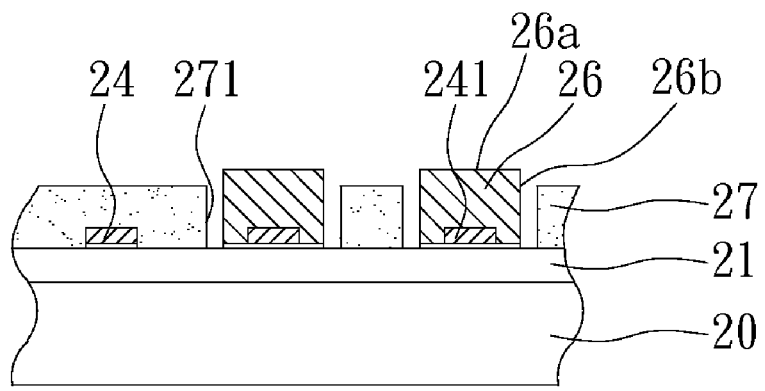

Referring to FIG. 2J, unexposed (uncured) portions of the insulating protective layer 27 are then removed, so as to form a plurality of recesses (a revealing portion) 270 on the insulating protective layer 27 that each expose the top 26a and a portion of the sides 26b of a corresponding one of the electroplated conductive posts 26. Then, unexposed portions of the insulating protective layer 27 under the recesses 270 are further exposed to light, so as to completely cure the recess 270. The recesses 270 do not penetrate down to the insulating protective layer 270. As a result, during subsequent packaging processes, the shape of the solder bumps formed on top of the electroplated conductive posts 26 approximates a circle, thus reducing concentration of stress and abnormality in bonding.

As an alternative, referring to FIG. 2J', the unexposed (uncured) portions of the insulating protective layer 27 are completely removed right down to the dielectric layer 21, such that openings (i.e. a revealing portion) 271 are formed to expose a portion of the dielectric layer 21 on the substrate 20 and completely expose the tops 26a and sides 26b of the electroplated conductive posts 26. During package bonding, solders may completely encapsulate the exposed electroplated conductive posts 26, thus reducing package stress.

The present invention further provides a semiconductor package substrate structure, which includes a substrate 20 having a plurality of circuits 24 and electrical connecting pads 241 formed on at least one surface thereof; a plurality of electroplated conductive posts 26 each fully covering the top 241a and the sides 241b of a corresponding one of the electrical connecting pads 241 and an insulating protective layer 27 formed on the surface of the substrate with a revealing portion in the form of recesses 270. The recesses 270 do not penetrate the insulating protective layer 27 but expose respective tops 26a and portions of sides 26b of the electroplated conductive posts 26.

A plurality of openings 271 penetrating the insulating protective layer 27 can alternatively be formed on the semiconductor package substrate to completely expose the tops 26a and sides 26b of the electroplated conductive posts 26.

A conductive layer 22 is disposed between a dielectric layer 21 and the electrically connecting pads and also between the dielectric layer 21 and the circuits 24, which can be made from copper, tin, nickel, chromium, titanium, copper-chromium or conductive polymers.

The electroplated conductive posts 26 can be made of metals such as lead, tin, silver, copper, gold, bismuth, antimony, zinc, nickel, chromium, magnesium, indium, tellurium, or gallium.

Second Embodiment

Figure 3A:
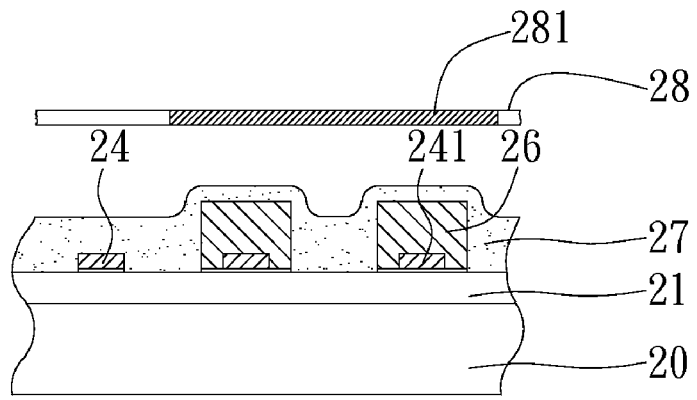
FIGS. 3A and 3B depict the flow for a method of manufacturing a substrate with an embedded semiconductor chip according to a second embodiment of the present invention.
Figure 3B:
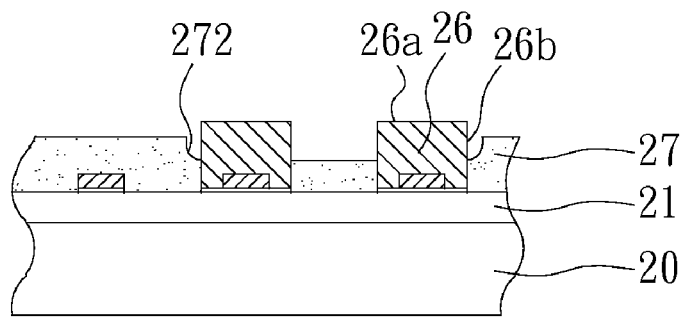
Figure 3B:
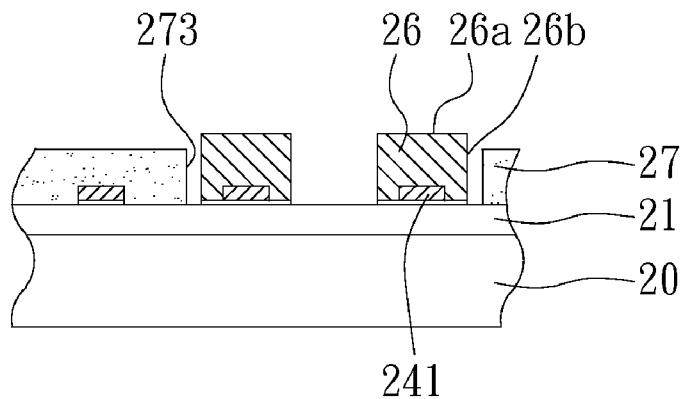

Referring to FIGS. 3A and 3B, another manufacturing method of the present invention is shown. It is different from the previous embodiment in that the opaque region of the photomask completely covers all the electroplated conductive posts, including the areas between the electroplated conductive posts.

Referring to FIG. 3A, which is an equivalent to the stage of FIG. 2I in the first embodiment. The opaque region 281' of the photomask 28 covers the electroplated conductive posts 26 and the areas between the electroplated conductive posts 26, and then the portions of the insulating protective layer 27 not masked by the opaque region 281 are exposed.

Referring to FIG. 3B, the unexposed portions of the insulating protective layer 27 are then removed, forming a revealing portion in the form of a recess 272 without penetrating the insulating protective layer 27 while exposing the tops 26a and a portion of the sides 26b of the various electroplated conductive posts. Thereafter, previously unexposed areas of the insulating protective layer 27 under the recess region are exposed so as to fully cure the recess 272. This can prevent overflow of the underfill used in packaging by controlling the flow of the underfill.

Referring to FIG. 3B' for another alternative of FIG. 3B, the unexposed (uncured) portions of the insulating protective layer 27 are completely removed to form a revealing portion in the form of a groove, which exposes portions of the dielectric layer of the substrate 20, thus preventing overflow of the underfill by controlling its flow and reducing package height and bonding stress.

The present invention further provides a semiconductor package substrate structure, which includes a substrate 20 having a plurality of circuits 24 and electrical connecting pads 241 formed on at least one surface thereof; a plurality of electroplated conductive posts 26 each fully covering the top 241a and the sides 241b of a corresponding one of the electrical connecting pads 241 and an insulating protective layer 27 formed on the surface of the substrate with a revealing portion in the form of a recess 272. The recess 272 does not penetrate the insulating protective layer 27 but exposes respective tops 26a and portions of sides 26b of the electroplated conductive posts 26.

A groove 273 penetrating the insulating protective layer 27 can alternatively be formed in the insulating protective layer 27 to completely expose the tops 26a and sides 26b of the electroplated conductive posts 26.

As for the semiconductor package substrate structure of the present invention and its manufacturing method, the electroplated conductive posts formed therein do not have wings like the prior art, thus stress caused by temperature variation is reduced. In addition, the electroplated conductive posts now fully encapsulate the tops and sides of the electrically connecting pads, a stronger bonding can be achieved. Moreover, since the width of the electrically connecting pads is similar to that of normal circuit layers, the width of the electroplated conductive posts can still be smaller than the conventional electroplated conductive posts with wings. Unlike the prior art where insulating protective layer is formed prior to the electroplating of the electroplated conductive posts, in the present invention, the insulating protective layer is formed on the substrate after the electroplated conductive posts are formed with a revealing portion in the form of a recess, opening or groove to expose the tops and sides of the electroplated conductive posts. This avoids the problems associated with aligning the openings of the resist layer and the insulating protective layer, such as the formation of wings on top of the electroplated conductive posts and limitation in reduction of intervals between the electroplated conductive posts. In addition, underfill can be confined in the revealing portion, eliminating overfill. As a result of the dented revealing portion, the overall thickness of the semiconductor package can also be reduced.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A semiconductor package substrate structure, comprising:
   a substrate with a plurality of electrically connecting pads formed on at least one surface thereof;
   a plurality of electroplated conductive posts each fully covering a corresponding one of the electrically connecting pads; and
   an insulating protective layer formed on the substrate with a revealing portion for exposing the electroplated conductive posts,
   wherein the revealing portion is a plurality of openings penetrating the insulating protective layer for exposing a portion of the substrate while fully exposing the tops and sides of the electroplated conductive posts.

2. A semiconductor package substrate structure, comprising:
   a substrate with a plurality of electrically connecting pads formed on at least one surface thereof;
   a plurality of electroplated conductive posts each fully covering a corresponding one of the electrically connecting pads; and
   an insulating protective layer formed on the substrate with a revealing portion for exposing the electroplated conductive posts,
   wherein the revealing portion is a groove penetrating the insulating protective layer for exposing a portion of the substrate while fully exposing the tops and sides of the electroplated conductive posts.

* * * * *